United States Patent

Oudoire et al.

Patent Number: 5,929,372
Date of Patent: Jul. 27, 1999

[54] THERMOELECTRIC GENERATOR

[75] Inventors: Philippe Oudoire, Les Pieux; Tony Mesnil, Tourlaville; Philippe Dubourdieu, Cherbourg; Géry Tribou; Gérard Burnouf, both of Equeurdreville Hainneville, all of France

[73] Assignee: Etat Francais Represente Par Delegue General pour l'Armement, Arcueil Cedex, France

[21] Appl. No.: 08/930,554

[22] PCT Filed: Mar. 3, 1997

[86] PCT No.: PCT/FR97/00548

§ 371 Date: Dec. 12, 1997

§ 102(e) Date: Dec. 12, 1997

[87] PCT Pub. No.: WO97/38451

PCT Pub. Date: Oct. 16, 1997

[30] Foreign Application Priority Data

Apr. 4, 1996 [FR] France .................................. 96 04228

[51] Int. Cl.⁶ .................................................. H01L 35/28
[52] U.S. Cl. ........................................... 136/208; 136/205
[58] Field of Search ..................... 136/205, 208, 136/210, 201, 212, 230

[56] References Cited

U.S. PATENT DOCUMENTS

| 3,054,840 | 9/1962 | Alsing | 136/210 |
| 3,097,027 | 7/1963 | Mims et al. | 308/189 |
| 3,663,306 | 5/1972 | Des Champs et al. | 136/202 |
| 3,794,527 | 2/1974 | Kim | 136/208 |
| 3,936,681 | 2/1976 | Liebe | 310/54 |
| 4,292,579 | 9/1981 | Constant | 322/2 R |
| 5,228,923 | 7/1993 | Hed | 136/208 |

*Primary Examiner*—Kathryn Gorgos
*Assistant Examiner*—Erica Smith-Hicks
*Attorney, Agent, or Firm*—Oliff & Berridge, PLC

[57] ABSTRACT

The present invention relates to an electric generator, of the type including thermoelectric cells electrically attached and insulated between both walls of a duct separating a moving internal fluid and an external fluid having a temperature different from that of the internal fluid. The thermoelectric cells are positioned in such a way that their surfaces of thermal exchange are approximately perpendicular to the outflow direction of the internal fluid. The thermoelectric cells are positioned on both faces of a flared flange radailly clamped onto the duct. An electric generator having these features provides increased electrical power and greater depth operation.

11 Claims, 3 Drawing Sheets

THERMOELECTRIC GENERATOR

The present invention relates to an electric generator, of the type including thermoelectric cells with semi-conductor elements, which uses the Seebeck effect and especially an underwater electric generator intended to equip drilling well heads.

For the power supply of the equipment (valves, instruments, etc.) of oil drilling wells, such electric generators are known which use the thermoelectric effect due to the difference of temperature between the extracted products, i.e oil, having a relatively high temperature (over 40° C.), which flow off into a drilling duct or pipe, and the underwater medium surrounding this duct at a much lower temperature, approximately a few degrees. Layers of thermo-elements are arranged concentrically in sleeves along the pipe and electrically connected in series or in parallel to produce a power supply. The surfaces of thermal exchange of these cells are tangential in relation to the circular section of the duct.

This arrangement limits the number of cells which can be disposed by unit of duct length. Thus, it is difficult to have more than eight cells on standard size pipes, for instance with a 150 mm diameter. As a result, the power supply provided by such a generator is notably reduced.

Another disadvantage of this assembly is that the performance in pressure of the thermoelectric cells is not guaranteed when the generator is very deeply immersed, as deep as 2,000 m on some sites.

Finally, the thermal exchanges inside the duct are not optimised.

The present invention remedies these disadvantages by proposing a thermoelectric generator which can provide increased electrical power and which can be immersed at great depths, for example down to 2,000 m especially on some oil drilling wells.

Therefore the objective of the invention is an electric generator, of the type including thermoelectric cells electrically attached and insulated between both walls of a duct separating a moving internal fluid and an external fluid having a temperature different from that of the internal fluid, characterised in that the thermoelectric cells are positioned in such a way that their surfaces of thermal exchange are approximately perpendicular to the outflow direction of the internal fluid.

According to an advantageous characteristic, the thermoelectric cells are positioned on both faces of a flared flange radially clamped onto the duct.

In one type of embodiment, the generator according to the invention is characterised in that it comprises at least one annular clip clamping and electrically insulating from the external fluid at least one flared flange and the thermoelectric cells which are positioned there.

Preferably, the generator comprises a tight stacking of flared flanges and clamping clips, located along the duct.

Other advantages of an electric generator according to the present invention will appear in the following description of a non limitative embodiment, in reference to the appended drawings in which.

Figure 4:
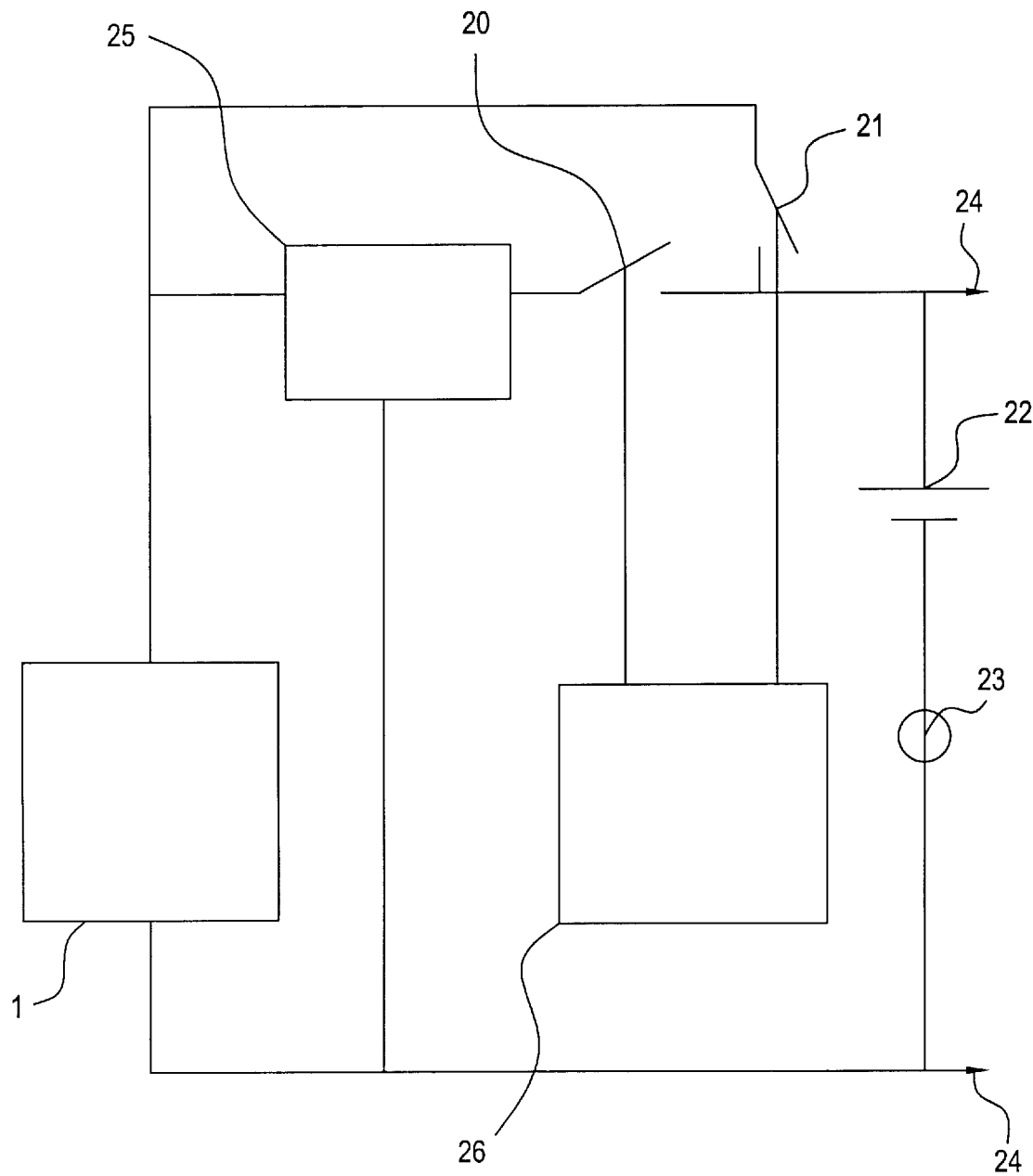

FIG. 4 schematizes the electric wiring associated with the generator.

Figure 1:
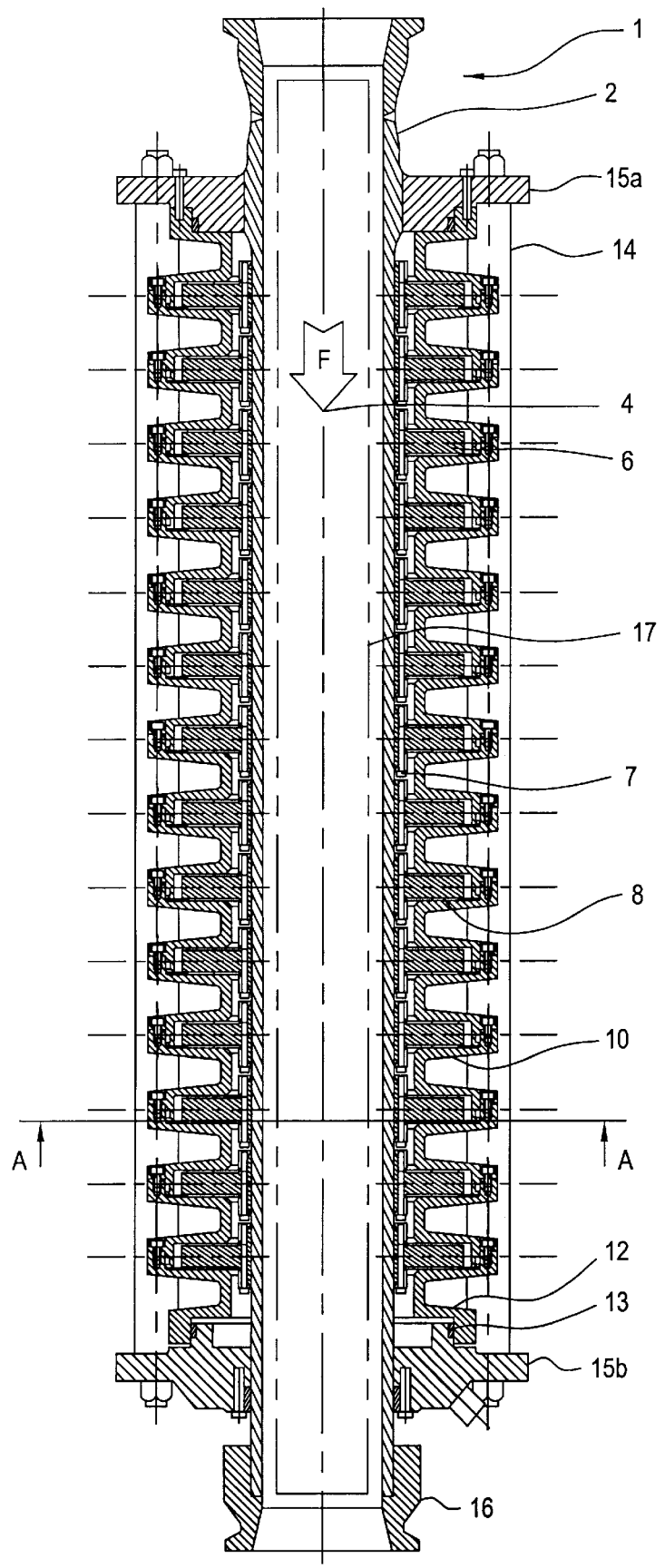
FIG. 1 is a longitudinal section of a generator.

FIG. 1 shows the thermoelectric generator having the general shape of a sleeve 1 around a duct or pipe 2 belonging to a well head, not represented, immersed in sea water 3. Duct 2 contains a liquid product 4, here oil, extracted by drilling, circulating for example in the direction of arrow F.

Figure 2:
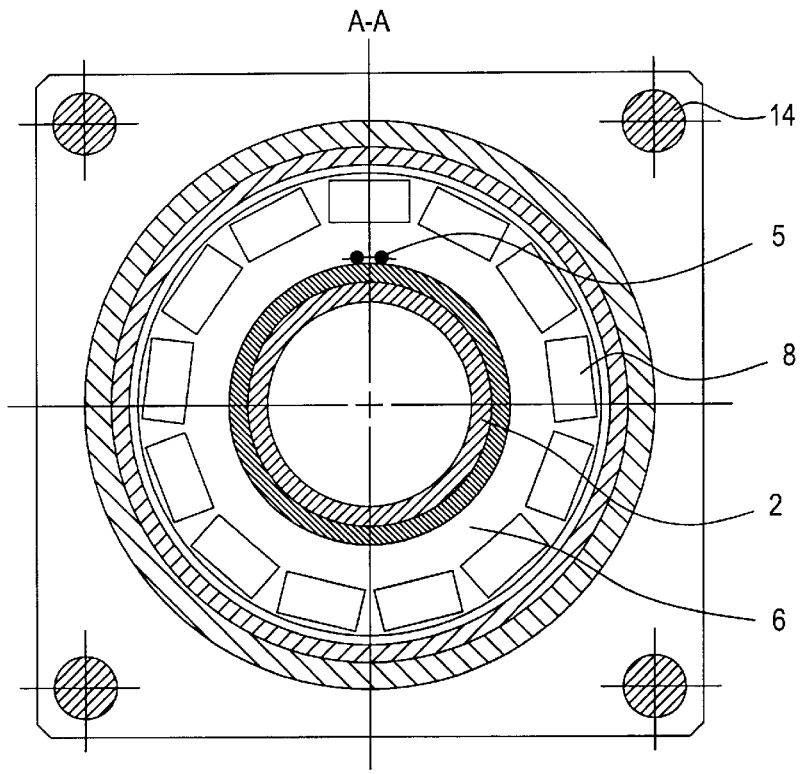
FIG. 2 is a section according to AA of FIG. 1.

The sleeve comprises a central tube 2, for example made of steel, on which flared flanges 6, made of copper for example, are radially attached. The flared flanges are held on the central tube by a known wedge bolt system 7 located along the duct. Thermoelectric cells 8 are located on each face of a flared flange 6. There are, for example 13 of them on each face, regularly distributed, near the peripheral part of flared flange 6. They are wired in series and connected to cable 5, as shown in FIG. 2.

Figure 3:
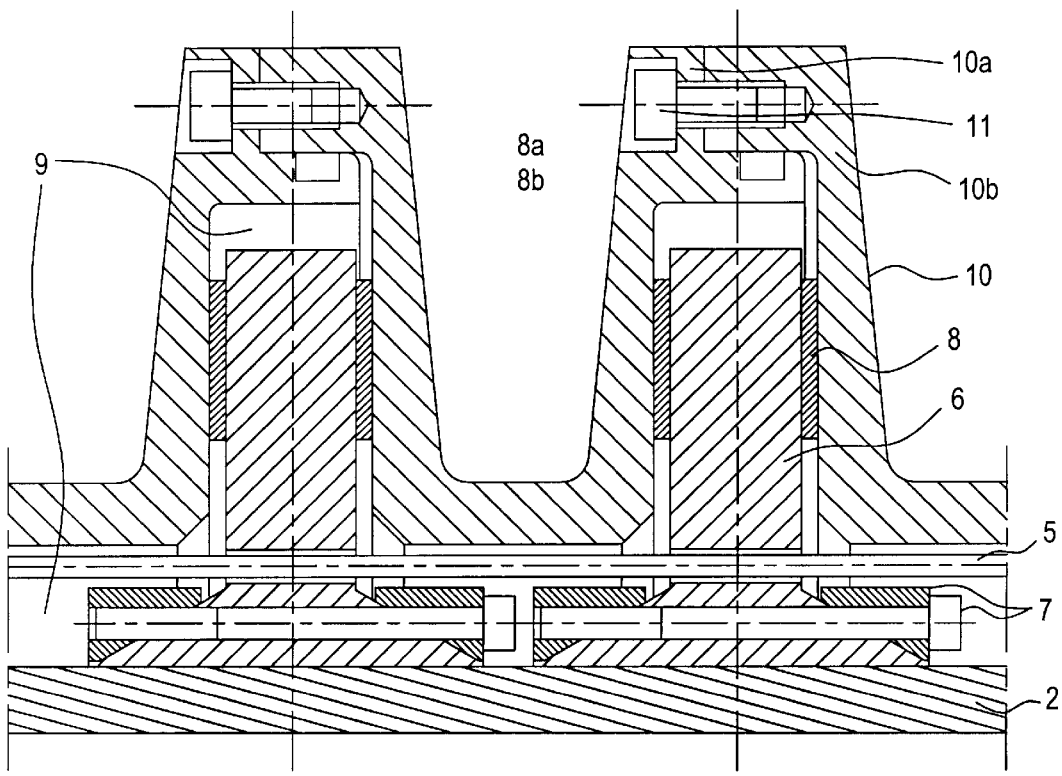
FIG. 3 shows a detailed section of embodiment according to AA of FIG. 2.

It is well known that each thermoelectric cell is a flat assembly of semi-conductor-based thermocouples in series. Faces 8$a$ and 8$b$, as shown in FIG. 3, allowing the thermal exchange, are therefore arranged perpendicular to the direction of outflow F of the liquid circulating in duct 2.

Known thermoelectric cells 8 are selected by taking into account their dimensions (length, width, thickness), the number of couples per module, and essentially the surface/thickness ratio of the constitutive thermo-element (N or P type) forming a half-couple.

A low thickness resulting in a low internal resistance is preferred. For example, thermoelements which have the shape of rectangular plates, approximately 60 by 30 mm, presenting 254 thermocouples including bismuth telluride are used, allowing operation up to a temperature of 300° C., with a surface/thickness ratio of 0.079 cm.

An electric insulating material surrounds each flared flange, and the thermoelectric cells are separated by a thermic and electric insulating material 9 to concentrate the flow through the modules.

Two adjacent flared flanges 6 are externally covered with an annular clip 10, made for example of cupro-aluminium. Two successive U-shaped clips having external upper edges, 10$a$ and 10$b$, are tightened on top of each other by screws 11.

End clips 12, as shown in FIG. 1 have a particular profile i.e.,: the dimension of the external diameter of gasket 13 is such that the stress exerted on each thermoelectric cell 8 through clip 10 when the latter is subjected to an external pressure, for example that of the underwater immersion, is independent of the value of this pressure. Thus, the generator according to the invention is suited to an operation at great underwater depth.

Hence the assembly consists of stacked elements located along duct 2.

In order to longitudinally hold this stack, forcing levers 14 are provided for, for example four (see FIG. 2), which rest, through known clamping means, on the four corners of end pieces 15$a$, 15$b$, as shown in FIG. 1. Therefore the closure and tightness of the stack is ensured by these forcing levers.

One of the end closing pieces, for example the upper one 15$a$ in FIG. 1 is solid by welding or other means with the external wall of duct 2, while the other end piece, for example 15$b$, is only blocked in rotation on external wall of duct 2, for example by means of a wedge bolt system so that all the forcing levers remain axial.

However part 15$b$ remains longitudinally free in order to avoid any deformation of the forcing levers.

Finally, the electric generator comprising the sleeve or staking described above is attached on pipe or duct 2 by a flared flange system 16, that is to say, a dismountable connection located on the side of end part 15$b$ which is not solid with duct 2.

The supply circuit of the equipment of a drilling well head is completed by the following provisions.

In reference to FIG. 4, thermoelectric generator 1 is electrically connected by means of two contactors 20 and 21, to battery 22, for example of the lead type with gelatinized electrolyte, the emitted hydrogen being eliminated either by catalyse or directly discharged in sea water, housed in a sealed caisson or in equipressure, at the terminals of which a current sensor 23 is located to supply network 24. The circuit comprises a regulator 25 and a processing cubicle 26 to control the contactor.

In normal operation, that is to say when the requested power is approximately 100 watts, contactor 20 is closed and contactor 21 is open. Thermoelectric generator 1 discharges at the entry of regulator 25 which holds battery 22 afloat under a constant voltage, for example approximately 17.6 V. So the network is supplied under constant voltage, thus limiting the power consumption and ensuring a wide autonomy, up to 5 years, without maintenance.

The temporary request of much more significant power, 1,000 watts for example, implies the implementation of the regulator and battery.

In case of power loss of the thermoelectric generator, for example by suppressing the circulation of hot oil in duct 2, contactor 20 is open and contactor 21 is also open; only the battery remains operational. When the hot source starts again, the battery can be recharged by the regulator or by the thermoelectric generator depending on its discharge level, by judiciously controlling contactors 20 and 21 processing the information, taking into account the value of the output voltage via processing cubicle 26.

Since the rated power requested on the network is not continuously consumed, the thermoelectric generator produces the complementary energy required to charge the battery of accumulators able to supply the power requested.

The performance of the described thermoelectric generator are the following: the internal hot fluid comprises oil circulating in a pipe, with a 150 mm diameter, at an approximate temperature of 60° C., with an approximate output of 500 m3 per day. The external cold fluid is sea water at 4° C., circulating at a maximum speed of 1 m/sec.

Twenty-six thermoelectric cells are arranged on each flared flange (13 on each face), and 26 stages of flared flange are stacked in a 1.7 m long sleeve. The power obtained with this embodiment is FLOW that is to say 100 watts per length unit of sleeve.

Due to the cathodic protection and choice of material (cupro-aluminium) constituting the flared flanges, the risk of corrosion is minimised. The external deposit of scale can be avoided by a coating of paint. The internal clogging can be suppressed by known means 17 such as an Archimedes screw, vanes attached to the inside wall of the duct, a baffle system that generates cross flows, a helical structure, perforated plates, etc., located on the internal wall of the duct where the internal fluid circulates, that is to say oil, in order to perturbate the outflow speed and increase the thermal exchanges between the internal fluid and this internal wall at the same time.

The generator according to the invention is very compact, which enables easy arrangement on an oil drilling head.

We claim:

1. An electric generator, comprising thermoelectric cells electrically attached and insulated between both walls of a duct separating a moving internal fluid and an external fluid, having a temperature different from that of the internal fluid, the thermoelectric cells positioned on both faces of a flared flange radially clamped on the duct and so that their surface of thermal exchange are approximately perpendicular to the outflow direction of the internal fluid.

2. A generator according to claim 1 characterised in that it comprises at least one annular clip clamping and electrically insulating at least one flared flange and the positioned thermoelectric cells from the external fluid.

3. A generator according to claim 2 characterised in that it comprises a sealed stack of flared flanges and clamping clips, located along the duct.

4. A generator according to claim 3 characterised in that the space defined between the sealed stack and the thermoelectric cells is filled with a thermally and electrically insulating product.

5. A generator according to claim 3 characterised in that annular clips at the end of the sealed stack are dimensioned so that the stress exerted on the thermoelectric cells by the clips arranged along the stack and subjected to an external pressure, is independent of the value of this pressure.

6. A generator according to claim 3 characterised in that it comprises forcing levers axially located at the flared flange periphery and on which two end parts, closing the stack rest.

7. A generator according to claim 6 characterised in that one of the closing parts is solid with the duct, the other closing part being at least blocked in rotation in relation to the other closing part, in such a way that the forcing levers remain axial.

8. A generator according to claim 7 characterised in that it comprises a dismountable connection located on the side of the closing part which is not solid with the duct.

9. A generator according to claim 1 characterised in that the duct comprises means to increase the thermal exchanges between the internal fluid and the internal wall of the duct.

10. A drilling head power supply system comprising the electric generator of claim 1.

11. An underwater electric generator according to claim 1, characterised in that it is coupled in parallel to a battery resisting underwater pressure, by means of a circuit notably comprising two contractors, a regulator and a processing cubicle.

* * * * *